(12) United States Patent
Leem et al.

(10) Patent No.: US 9,379,343 B2
(45) Date of Patent: Jun. 28, 2016

(54) LIGHT TRANSMISSIVE ELECTRODE, ORGANIC PHOTOELECTRIC DEVICE, AND IMAGE SENSOR

(71) Applicant: Samsung Electronics Co., Ltd., Suwon-Si, Gyeonggi-Do (KR)

(72) Inventors: Dong Seok Leem, Hwaseong-si (KR); Kyu Sik Kim, Yongin-si (KR); Jung Woo Kim, Hwaseong-si (KR); Kyung Bae Park, Hwaseong-si (KR); Kwang Hee Lee, Yongin-si (KR); Seon Jeong Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 13/957,994

(22) Filed: Aug. 2, 2013

(65) Prior Publication Data
US 2014/0070189 A1    Mar. 13, 2014

(30) Foreign Application Priority Data
Sep. 10, 2012    (KR) ................ 10-2012-0100044

(51) Int. Cl.
*H01L 29/08*    (2006.01)
*H01L 51/52*    (2006.01)
*H01L 51/44*    (2006.01)
*H01L 51/00*    (2006.01)

(52) U.S. Cl.
CPC .......... *H01L 51/442* (2013.01); *H01L 51/5203* (2013.01); *H01L 51/5215* (2013.01); *H01L 51/5234* (2013.01); *H01L 51/0021* (2013.01); *Y02E 10/549* (2013.01)

(58) Field of Classification Search
CPC .................. H01L 51/442; H01L 51/5203
USPC ............................................ 257/40, 98
See application file for complete search history.

(56) References Cited

U.S. PATENT DOCUMENTS

| | | |
|---|---|---|
| 7,452,488 B2 | 11/2008 | Kumar et al. |
| 7,727,910 B2 | 6/2010 | Ahn et al. |
| 8,211,337 B2 | 7/2012 | Hasegawa et al. |
| 2004/0159903 A1* | 8/2004 | Burgener et al. ............ 257/432 |
| 2005/0062412 A1* | 3/2005 | Taniguchi et al. ........... 313/512 |
| 2007/0007882 A1 | 1/2007 | Fukuoka et al. |
| 2010/0123152 A1* | 5/2010 | Sugisawa et al. ............ 257/98 |
| 2010/0258797 A1* | 10/2010 | Yamamoto et al. ........... 257/43 |
| 2011/0007012 A1* | 1/2011 | Shih ............................. 345/173 |
| 2011/0068327 A1 | 3/2011 | Morishima |

(Continued)

FOREIGN PATENT DOCUMENTS

| | | |
|---|---|---|
| CN | 102983277 A | 3/2013 |
| CN | 103258870 A | 8/2013 |

(Continued)

OTHER PUBLICATIONS

European Search Report issued on Dec. 20, 2013 in the corresponding European Patent Application No. 13182678.6.

*Primary Examiner* — Moazzam Hossain
(74) *Attorney, Agent, or Firm* — Harness, Dickey & Pierce, P.L.C.

(57) ABSTRACT

According to example embodiments, a transmissive electrode may include a light transmission layer. The light transmission layer may include a metal and a metal oxide that is included in a smaller amount than the metal. According to example embodiments, an organic photoelectric device, as well as an image sensor, may include the transmissive electrode.

20 Claims, 14 Drawing Sheets

(56) References Cited

U.S. PATENT DOCUMENTS

| | | | |
|---|---|---|---|
| 2011/0073897 A1* | 3/2011 | Kang et al. | 257/98 |
| 2011/0127505 A1 | 6/2011 | Nakamura et al. | |
| 2011/0177312 A1 | 7/2011 | Tanaka et al. | |
| 2012/0228647 A1* | 9/2012 | Yamamoto | 257/88 |

FOREIGN PATENT DOCUMENTS

| | | | |
|---|---|---|---|
| EP | 1651011 | A1 | 4/2006 |
| EP | 2184794 | A1 | 5/2010 |
| EP | 2325914 | A1 | 5/2011 |
| JP | 2002367784 | A | 12/2002 |
| JP | 2010092693 | A | 4/2010 |
| KR | 2009-0128411 | A | 12/2009 |
| KR | 2010-0071230 | A | 6/2010 |
| KR | 2011-0049389 | A | 5/2011 |
| KR | 2011-0094964 | A | 8/2011 |
| KR | 2011-0107934 | A | 10/2011 |
| KR | 2011-0111230 | A | 10/2011 |
| KR | 2012-0028505 | A | 3/2012 |
| WO | WO-2012002723 | A2 | 1/2012 |

* cited by examiner

LIGHT TRANSMISSIVE ELECTRODE, ORGANIC PHOTOELECTRIC DEVICE, AND IMAGE SENSOR

CROSS-REFERENCE TO RELATED APPLICATION

This application claims priority under 35 U.S.C. §119 to Korean Patent Application No. 10-2012-0100044, filed in the Korean Intellectual Property Office on Sep. 10, 2012, the entire contents of which are incorporated herein by reference.

BACKGROUND

1. Field

Example embodiments relate to a transmissive electrode, a photoelectric device and/or an image sensor including the same.

2. Description of the Related Art

A photoelectric device may convert light into an electrical signal. Examples of photoelectric devices include a photodiode, a phototransistor, and the like. A photoelectric device may be applied to an image sensor, a solar cell, an organic light emitting device, and the like.

An image sensor including a photodiode may have higher resolution and accordingly a smaller pixel. At present, a silicon photodiode may be used. Silicon photodiodes may have less sensitivity when the pixel is smaller due to a smaller absorption area. Accordingly, an organic material that is capable of replacing silicon has been researched.

Organic materials may have a high extinction coefficient and may selectively absorb light in a particular wavelength region depending on a molecular structure, and thus may simultaneously replace a photodiode and a color filter and improve sensitivity and contribute to high integration.

In order to realize a photodiode having a higher photoelectric conversion efficiency based on the organic material, it is desirable to improve characteristics of a transmissive electrode.

SUMMARY

Example embodiments relate to a transmissive electrode having light transmittance and electrical properties.

Example embodiments relate to an organic photoelectric device including the transmissive electrode.

Example embodiments relate to an image sensor including the organic photoelectric device.

According to example embodiments, a transmissive electrode may include a light transmission layer including a metal and a metal oxide that is included in a smaller amount than the metal.

In example embodiments, a weight ratio of the metal and metal oxide may be about 99.9:0.1 to about 60:40.

In example embodiments, the metal may include at least one of silver (Ag), aluminum (Al), copper (Cu), gold (Au), and an alloy thereof, and the metal oxide may include one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

In example embodiments, a thickness of the light transmission layer may be about 1 nm to about 50 nm.

In example embodiments, a sheet resistance of the light transmission layer may be less than or equal to about 1 k$\Omega$/sq., and a light transmittance of the light transmission layer may be more than about 50% at a wavelength of about 540 nm.

In example embodiments, the transmissive electrode may further include a light transmission auxiliary layer on one side of the light transmission layer.

In example embodiments, a material of the light transmission auxiliary layer may have a refractive index of about 1.6 to about 2.5.

In example embodiments, the light transmission auxiliary layer may include at least one of a metal oxide, a metal sulfide, and an organic material.

In example embodiments, the metal oxide may one of include zinc oxide, indium oxide, tin oxide, indium tin oxide (ITO), indium zinc oxide (IZO), aluminum oxide, aluminum tin oxide (ATO), fluorine doped tin oxide (FTO), molybdenum oxide, tungsten oxide, vanadium oxide, rhenium oxide, niobium oxide, tantalum oxide, titanium oxide, nickel oxide, copper oxide, cobalt oxide, manganese oxide, chromium oxide, and a combination thereof, the metal sulfide may include zinc sulfide (ZnS), and the organic material may include an amine derivative.

According to example embodiments, an organic photoelectric device may include a first electrode; a second electrode on the first electrode; and an active layer between the first electrode and second electrode. At least one of the first electrode and the second electrode may include a light transmission layer. The light transmission layer may include a metal and a metal oxide that is included in a smaller amount than the metal.

In example embodiments, a weight ratio of the metal and the metal oxide may be about 99.9:0.1 to about 60:40.

In example embodiments, the metal may include at least one of silver (Ag), aluminum (Al), copper (Cu), gold (Au), and an alloy thereof.

In example embodiments, the metal oxide may include one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

In example embodiments, a thickness of the light transmission layer may be about 1 nm to about 50 nm.

In example embodiments, a sheet resistance of the light transmission layer may be less than or equal to about 1 k$\Omega$/sq, and a light transmittance of the light transmission layer may be more than about 50% at a wavelength of about 540 nm.

In example embodiments, at least one of the first and second electrodes may further include a light transmission auxiliary layer on one side of the light transmission layer.

In example embodiments, a material of the light transmission auxiliary layer may have a refractive index of about 1.6 to about 2.5.

In example embodiments, the light transmission auxiliary layer may include at least one of a metal oxide compound, a metal sulfide, and an organic material.

In example embodiments, the metal oxide compound may include one of zinc oxide, indium oxide, tin oxide, indium tin oxide (ITO), indium zinc oxide (IZO), aluminum oxide, aluminum tin oxide (ATO), fluorine doped tin oxide (FTO), molybdenum oxide, tungsten oxide, vanadium oxide, rhenium oxide, niobium oxide, tantalum oxide, titanium oxide, nickel oxide, copper oxide, cobalt oxide, manganese oxide, chromium oxide, and a combination thereof, the metal sulfide may include zinc sulfide (ZnS), and the organic material may include an amine derivative.

In example embodiments, the organic photoelectric device may further include a charge auxiliary layer between at least one of the first electrode and the active layer and the second electrode and the active layer.

In example embodiments, an image sensor may include the organic photoelectric device.

In example embodiments, an image sensor, an organic light emitting diode (OLED) may include the transmissive electrode.

BRIEF DESCRIPTION OF THE DRAWINGS

The foregoing and other features and advantages of example embodiments will be apparent from the more particular description of non-limiting embodiments, as illustrated in the accompanying drawings in which like reference characters refer to the same parts throughout the different views. The drawings are not necessarily to scale, emphasis instead being placed upon illustrating principles of example embodiments. In the drawings.

DETAILED DESCRIPTION

Figure 1:
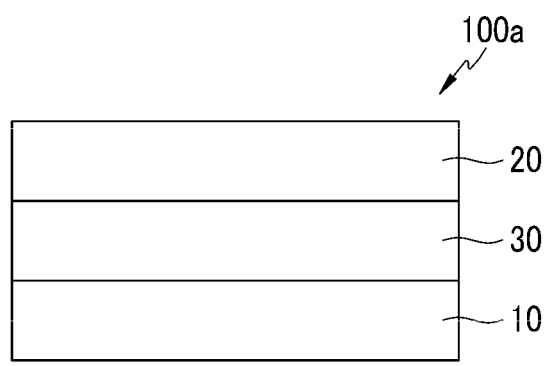
FIG. 1 is a cross-sectional view showing an organic photoelectric device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Parts having no relationship with the description are omitted for clarity, and the same or similar constituent elements are indicated by the same reference numeral throughout the specification.

First, a transmissive electrode according to example embodiments is described.

In example embodiments, a transmissive electrode may include a light transmission layer including a metal and a metal oxide, and the metal oxide may be included in a smaller amount than the metal.

The metal may be included as a host in the light transmission layer, and the metal oxide may be included as a dopant in the light transmission layer.

The metal may include any material having transflective characteristics with a thin thickness without particular limitation, for example, at least one selected from silver (Ag), aluminum (Al), copper (Cu), gold (Au), and an alloy thereof.

The metal oxide may include any material having light transmittance without particular limitation, for example, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The metal and metal oxide may be included in a weight ratio of about 99.9:0.1 to about 60:40. When the metal and the metal oxide are included in the ratio, light transmission of the light transmission layer may be improved and electrical properties may be secured without largely deteriorating conductivity. The metal and metal oxide may be included in a weight ratio of about 99.0:1.0 to about 80:20.

The light transmission layer may be formed, for example, in a thermal evaporation method by codepositing a metal boat and a metal oxide boat.

The light transmission layer may have a thickness of about 1 nm to about 50 nm. When the light transmission layer has a thickness within the range, electrical properties as well as light transmittance may be secured. Within the range, the light transmission layer may have a thickness of about 3 nm to about 30 nm.

The light transmission layer may have a sheet resistance of less than or equal to about 1 kΩ/sq. and light transmittance of more than about 50% at a wavelength of about 540 nm. The sheet resistance may be, for example, about 20 Ω/sq. to 800 Ω/sq., and the light transmittance may be, for example, more than about 50% and less than about 95%.

The transmissive electrode may further include a light transmission auxiliary layer disposed on one side of the light transmission layer.

The light transmission auxiliary layer may be disposed at a side where a light enters and may decrease the reflection of the entered light, and thus may further improve light absorbance.

The light transmission auxiliary layer may include a material having a refractive index of about 1.6 to about 2.5, for example, at least one selected from a metal oxide, a metal sulfide, and an organic material which have a refractive index within the range.

The metal oxide may include, for example, zinc oxide, indium oxide, tin oxide, indium tin oxide (ITO), indium zinc oxide (IZO), aluminum oxide, aluminum tin oxide (ATO), fluorine doped tin oxide (FTO), molybdenum oxide, tungsten oxide, vanadium oxide, rhenium oxide, niobium oxide, tantalum oxide, titanium oxide, nickel oxide, copper oxide, cobalt oxide, manganese oxide, chromium oxide, or a combination thereof, the metal sulfide may include, for example, zinc sulfide (ZnS), and the organic material may include, for example, an amine derivative.

The transmissive electrode may be applicable to any transmissive electrode used in an electronic device. For example, the transmissive electrode may be one that is related to influx and/or outflux of light such as a solar cell, an image sensor, a photo-detector, a photo-sensor, and an organic light emitting diode (OLED).

Hereinafter, referring to drawings, an electronic device including the transmissive electrode is described. FIG. 1 is a cross-sectional view showing an organic photoelectric device according to example embodiments.

Referring to FIG. 1, an organic photoelectric device 100a according to example embodiments may include a first electrode 10 and a second electrode 20 facing each other, and an active layer 30 interposed between the first electrode 10 and the second electrode 20. The second electrode 20 may be on the first electrode 10.

One of the first and second electrodes 10 and 20 may be an anode, and the other may be a cathode.

At least one of the first electrode 10 and the second electrode 20 may be a transmissive electrode. That is to say, at least one of the first electrode 10 and the second electrode 20 may be a transmissive electrode and the other may be an opaque electrode. Alternatively, both the first electrode 10 and the second electrode 20 may be a transmissive electrode. The transmissive electrode is described hereafter.

The active layer 30 may include a mixed p-type semiconductor material and n-type semiconductor material to form a pn junction. The active layer 30 may receive light from an external source, generate excitons, and separate the excitons into holes and electrons. The active layer 30 may include an intrinsic layer including both a p-type semiconductor and an n-type semiconductor, and may be, for example, formed using a method such as co-deposition. The active layer 30 may further include at least one of a p-type layer and an n-type layer as well as the intrinsic layer, and the p-type layer may include a p-type semiconductor and the n-type layer may include an n-type semiconductor.

The p-type semiconductor may include, for example, a compound such as N,N'-dimethyl-quinacridone (NNQA), diindenoperylene, dibenzo{[f,f']-4,4',7,7'-tetraphenyl}diindeno[1,2,3-cd:1',2',3'-Im]perylene, and the like, but is not limited thereto. The n-type semiconductor may include, for example, a compound such as dicyanovinyl-terthiophene (DCV3T), fullerene, a fullerene derivative, perylene diimide, and the like, but is not limited thereto.

As described above, at least one of the first electrode 10 and the second electrode 20 may be a transmissive electrode. The transmissive electrode may be disposed at a side that light enters. For example, when light enters toward the first electrode 10, the first electrode 10 may be a transmissive electrode. When light enters toward the second electrode 20, the second electrode 20 may be a transmissive electrode. Alternatively, when light enters toward the first electrode 10 or the second electrode 20 and then goes out through the second electrode 20 or the first electrode 10, both the first electrode 10 and the second electrode 20 may be transmissive electrodes.

Herein, the second electrode 20 as a transmissive electrode is described for ease of description.

The second electrode 20 may include a metal and a metal oxide. The metal oxide may be included in a smaller amount than the metal. The metal as a host may be included in the second electrode 20, and the metal oxide as a dopant may be included in the second electrode 20.

The metal may include any metal having a transflective characteristic at a thin thickness without particular limitation. For example, the metal may include at least one selected from silver (Ag), aluminum (Al), copper (Cu), gold (Au), and an alloy thereof. For example, when aluminum (Al) is very thin, such as less than about 30 nm, and/or less than about 20 nm, aluminum (Al) may have a transflective characteristic. However, at a higher thickness, aluminum may have an opaque characteristic.

The metal oxide may include any metal oxide having light transmittance without particular limitation. For example, the metal oxide may include at least one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The metal oxide may be an oxide based on the metal. For example, the metal may be copper (Cu) and the metal oxide may be copper oxide. Alternatively, the metal oxide may be an oxide based on a different material than the metal. For example, as discussed in Examples 1 to 8, the metal may be silver (Ag), and the metal oxide may be molybdenum oxide.

The second electrode 20 may be formed, for example, in a thermal deposition process specifically by codepositing a metal boat and a metal oxide boat. This thermal deposition may limit (and/or prevent) an organic material in the active layer 30 from being damaged by plasma generated during the physical deposition such as sputtering and thus the active layer 30 from being degraded.

The metal and the metal oxide may be included in a weight ratio of about 99.9:0.1 to about 60:40. When the metal and the metal oxide are included within the ratio range, light transmission may be improved and electrical properties may be secured without deteriorating conductivity.

Within the above range, the metal and metal oxide may be included in a weight ratio of about 99.0:1.0 to about 80:20.

The second electrode 20 may have a thickness of about 1 nm to about 50 nm. When the second electrode 20 has a thickness within the range of about 1 nm to about 50 nm, electrical properties as well as light transmittance may be secured. Within the range, the second electrode may have a thickness of about 3 nm to about 30 nm.

The light transmission layer may have sheet resistance of less than or equal to about 1 kΩ/sq. and light transmittance of more than about 50% at a wavelength of about 540 nm. The sheet resistance may be, for example, about 20 Ω/sq. to 800 Ω/sq., and the light transmittance may be, for example, more than about 50% and less than about 95%.

When the first electrode 10 is an opaque electrode, the first electrode 10 may be made of, for example, an opaque conductor such as aluminum (Al). When the first electrode 10 is a transmissive electrode, the first electrode 10 may be a transmissive electrode including the above-described metal and metal oxide, or may be a generally-used transmissive electrode of indium tin oxide (ITO), indium zinc oxide (IZO), and the like.

Although a thermal deposition may be used to form the second electrode 20, or the first electrode 10 when the first electrode 10 may be a transmissive electrode, example embodiments are not limited thereto. For example, a Facing Target Sputtering (FTS) process, which may reduce damage to an organic material in the active layer 30 compared to other sputtering processes such, may alternatively be used to form the second electrode 20, or the first electrode 10 when the first electrode 10 may be a transmissive electrode.

The organic photoelectric device 100 may produce excitons when the active layer 30 absorbs light of a desired (and/or alternatively predetermined) wavelength region entering from the first electrode 10 and/or the second electrode 20. The excitons may be separated into holes and electrons in the active layer 30. The separated holes may move toward an anode while the electrons may move toward a cathode, thereby forming a current in the organic photoelectric device.

Figure 2:
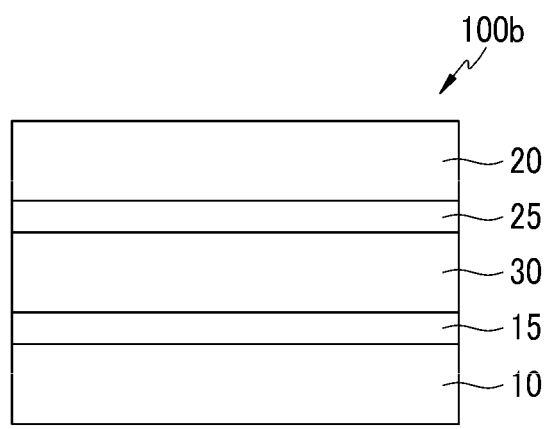
FIG. 2 is a cross-sectional view showing an organic photoelectric device according to example embodiments.

FIG. 2 is a cross-sectional view showing an organic photoelectric device according to example embodiments.

Referring to FIG. 2, an organic photoelectric device 100b according to example embodiments may include the first electrode 10 and the second electrode 20 facing each other, and the active layer 30 interposed between the first electrode 10 and the second electrode 20.

Additionally, unlike the organic photoelectric device 100a described previously, the organic photoelectric device 100b may further include charge auxiliary layers 15 and 25 between the first electrode 10 and the active layer 30 and between the second electrode 20 and the active layer 30, respectively. The charge auxiliary layers 15 and 25 may facilitate movement of holes and electrons separated from the active layer 30 and thus increase efficiency.

The charge auxiliary layers 15 and 25 may be at least one selected from a hole injection layer (HIL) facilitating injection of holes, a hole transporting layer (HTL) facilitating transportation of the holes, an electron blocking layer (EBL) blocking movement of electrons, an electron injecting layer (EIL) facilitating injection of the electrons, an electron transporting layer (ETL) facilitating transportation of the electrons, and a hole blocking layer (HBL) blocking movement of the holes.

For example, when the first electrode 10 is an anode, and the second electrode 20 is a cathode, the charge auxiliary layer 15 may be the hole injection layer HIL, hole transport layer HTL, and/or electron blocking layer, and the charge auxiliary layer 25 may be the electron injection layer (EIL), electron transport layer ETL, and/or hole blocking layer.

In addition, when the first electrode 10 is a cathode and the second electrode 20 is an anode, the charge auxiliary layer 15 may be the electron injection layer (EIL), electron transport layer (ETL), and/or hole blocking layer, and the charge auxiliary layer 25 may be the hole injection layer (HIL), hole transport layer (HTL), and/or electron blocking layer (EBL).

The hole transport layer (HTL) may include one selected from, for example, poly(3,4-ethylenedioxythiophene):poly (styrenesulfonate) (PEDOT:PSS); polyarylamine; poly(N-vinylcarbazole); polyaniline; polypyrrole; N,N,N',N'-tetrakis (4-methoxyphenyl)-benzidine (TPD); 4-bis[N-(1-naphthyl)-N-phenyl-amino]biphenyl (α-NPD); m-MTDATA; 4,4',4"-tris(N-carbazolyl)-triphenylamine (TCTA); a metal oxide such as molybdenum oxide, tungsten oxide, vanadium oxide, rhenium oxide, nickel oxide, copper oxide, and the like; and a combination thereof, without limitation.

The electron blocking layer (EBL) and/or hole injection layer (HIL) may include one selected from, for example, poly(3,4-ethylenedioxythiophene):poly(styrenesulfonate) (PEDOT:PSS); polyarylamine; poly(N-vinylcarbazole); polyaniline; polypyrrole, N,N,N',N'-tetrakis(4-methoxyphenyl)-benzidine (TPD); 4-bis[N-(1-naphthyl)-N-phenyl-amino]biphenyl (α-NPD); m-MTDATA, 4,4',4"-tris(N-carbazolyl)-triphenylamine (TCTA); a metal oxide such as molybdenum oxide, tungsten oxide, vanadium oxide, rhenium oxide, nickel oxide, copper oxide, and the like; and a combination thereof, without limitation.

The electron transport layer (ETL) may include one selected from, for example, dicyanovinyl-terthiophene (DCV3T), 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, without limitation.

The hole blocking layer (HBL) may include may include one selected from, for example, dicyanovinyl-terthiophene (DCV3T), 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, without limitation.

Figure 3:
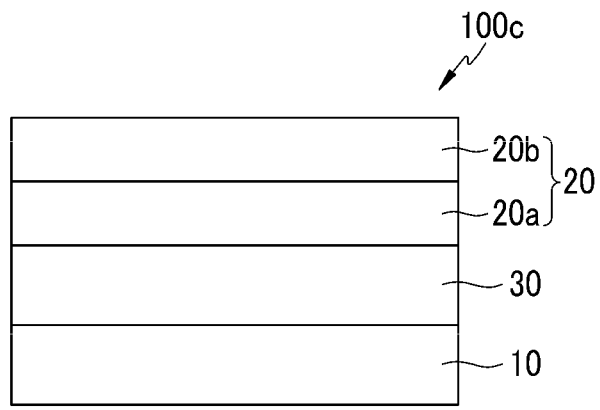
FIG. 3 is a cross-sectional view showing an organic photoelectric device according to example embodiments.

FIG. 3 is a cross-sectional view showing an organic photoelectric device according to example embodiments.

Referring to FIG. 3, an organic photoelectric device 100c according to example embodiments may include the first electrode 10 and the second electrode 20 facing each other, and the active layer 30 between the first electrode 10 and the second electrode 20.

However, unlike the organic photoelectric devices 100a and 100b, the organic photoelectric device 100c may include the second electrode 20 made as a double-layered transmissive electrode.

According to example embodiments, the second electrode 20 may include a light transmission auxiliary layer 20b on one side of a light transmission layer 20a that includes a metal and a metal oxide that is included in a smaller amount than the metal.

The light transmission auxiliary layer 20b may be disposed at a side toward which light enters, and thus decreases a reflective index of the entered light and further improves light absorbance.

The light transmission auxiliary layer 20b may include, for example, a material having a refractive index of about 1.6 to about 2.5, and specifically, at least one selected from a metal oxide, a metal sulfide, and an organic material having a refractive index within the range. The light transmission auxiliary layer 20b may have a thickness of about 20 nm to about 60 nm.

The metal oxide may include, for example, zinc oxide, indium oxide, tin oxide, indium tin oxide (ITO), indium zinc oxide (IZO), aluminum oxide, aluminum tin oxide (ATO), fluorine doped tin oxide (FTO), molybdenum oxide, tungsten oxide, vanadium oxide, rhenium oxide, niobium oxide, tantalum oxide, titanium oxide, nickel oxide, copper oxide, cobalt oxide, manganese oxide, chromium oxide, or a combination thereof, the metal sulfide may include, for example, zinc sulfide (ZnS), and the organic material may include, for example, an amine derivative.

The light transmission auxiliary layer 20b may be positioned on one side of the light transmission layer 20a and does not contact the active layer 30, and thus may be formed by physical deposition such as sputtering other than the thermal evaporation.

Even though FIG. 3 illustrates an example where the second electrode 20 may be a transmissive electrode, example embodiments are not limited thereto. For example, the first electrode 10 may be a double-layered transmissive electrode like the second electrode 20 illustrated in FIG. 3 and/or both the first electrode 10 and the second electrode 20 may be double-layered transmissive electrodes.

Figure 4:
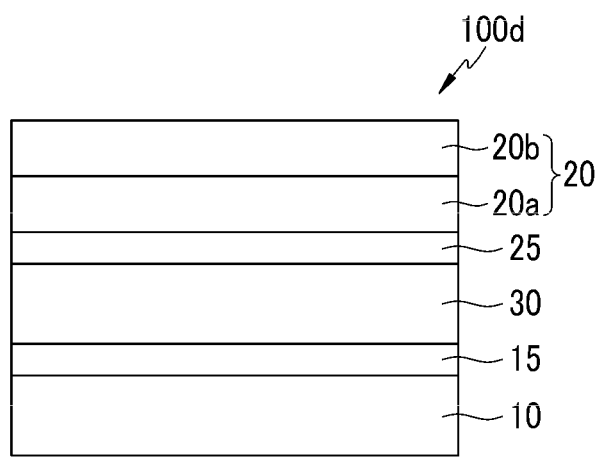
FIG. 4 is a cross-sectional view showing an organic photoelectric device according to example embodiments.

FIG. 4 is a cross-sectional view showing an organic photoelectric device according to example embodiments.

Referring to FIG. 4, the organic photoelectric device 100d according to example embodiments may include the first electrode 10 and the second electrode 20 facing each other and the active layer 30 between the first electrode 10 and the second electrode 20. In addition, the second electrode 20 may include a light transmission layer 20a and a light transmission auxiliary layer 20b.

The organic photoelectric device 100d may further include charge auxiliary layers 15 and 25 between the first electrode 10 and the active layer 30 and between the second electrode 20 and the active layer 30, respectively. The charge auxiliary layers 15 and 25 may facilitate movement of holes and electrons separated from the active layer 30, and thus increase efficiency as aforementioned.

According to example embodiments, the organic photoelectric devices 100a to 100d may be applied to a solar cell, an image sensor, a photo-detector, a photo-sensor, an organic light emitting diode (OLED), and the like, but is not limited thereto.

Hereinafter, image sensors fabricated by applying the organic photoelectric devices according to example embodiments are described with reference to FIGS. 5A to 5E. Herein, an organic CMOS image sensor as an example of the image sensor is illustrated.

FIGS. 5A to 5E are cross-sectional views organic CMOS image sensors according to example embodiments.

Figure 5A:
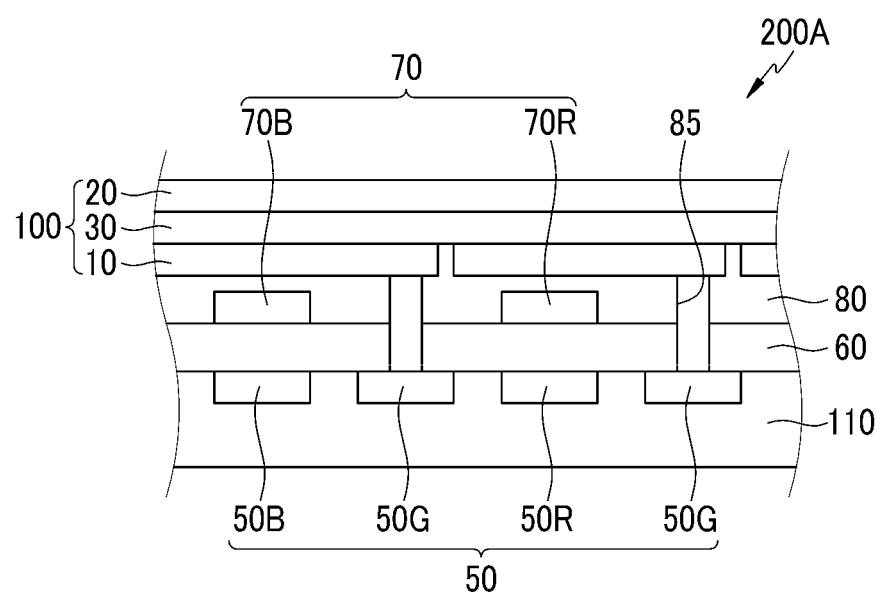
FIGS. 5A to 5E are cross-sectional views of organic CMOS image sensors according to example embodiments.

FIG. 5A illustrates blue, green, and red pixels adjacent to one another, but is not limited thereto. Hereinafter, a constituent element marked by a reference numeral 'B' is included in a blue pixel, another constituent element marked by a reference numeral 'G' is included in a green pixel, and still another constituent element marked by a reference numeral 'R' is included in a red pixel.

Referring to FIG. 5A, an organic CMOS image sensor 200A according to example embodiments may include a semiconductor substrate 110 in which a photo-sensing device 50 and a transporting transistor (not shown) are integrated, a lower insulation layer 60, color filters 70B and 70R, an upper insulation layer 80, and an organic photoelectric device 100.

The semiconductor substrate 110 may be a silicon substrate in which the photo-sensing device 50 and the transporting transistor (not shown) are integrated. The photo-sensing device 50 may be a photodiode. The photo-sensing device 50 and the transporting transistor may be integrated in each pixel. As shown in FIG. 5A, the photo-sensing device 50 may include a photo-sensing device 50B of the blue pixel, a photo-sensing device 50G of the green pixel, and a photo-sensing device 50R of the red pixel. The photo-sensing device 50 may sense light and generate a signal corresponding to the sensed light, and the transporting transistor may transfer a signal corresponding to the sensed light.

In addition, a metal wire (not shown) and a pad (not shown) may be formed on the semiconductor substrate 110. The metal wire and the pad may be made of a metal having resistivity to decrease signal delay, for example, aluminum (Al), copper (Cu), silver (g), and an alloy thereof, but is not limited thereto.

Then, a lower insulation layer 60 may be formed on the metal wire and the pad. The lower insulation layer 60 may be made of an inorganic insulating material such as silicon oxide and/or silicon nitride, or a low dielectric constant (low K) material such as SiC, SiCOH, SiCO, and SiOF.

The lower insulation layer 60 may have a trench (not shown) respectively revealing the photo-sensing devices 50B, 50G, and 50R of each pixel. The trench may be filled with a filler.

On the lower insulating layer 60, a color filter 70 may be formed. The color filter 70 may include a blue filter 70B formed in a blue pixel and a red filter 70R formed in a red pixel. According to example embodiments, the color filter 70 does not include a green filter, but may include the green filter.

On the color filter 70, an upper insulation layer 80 may be formed. The upper insulation layer 80 may removes a step difference due to the color filter 70. In other words, an upper surface of the upper insulation layer 80 may be generally flat over the color filters 70. The upper insulation layer 80 and the lower insulation layer 60 have a contact hole (not shown) exposing the pad and a penetration hole 85 exposing the photo-sensing device 50G of the green pixel.

On the upper insulation layer 80, the organic photoelectric device 100 may be formed. Additionally, as shown in FIG. 5E, a CMOS image sensor 200E according to example embodiments may further include an insulating layer 90 and lens layer 95 stacked on the organic photoelectric device 100. The insulating layer 90 may include an insulating material, an anti-reflective coating, and/or an infrared filter. For example, the insulating layer 90 may include silicon oxide and/or silicon nitride, but example embodiments are not limited thereto. The lens layer 95 may include lenses arranged over the photo-sensing devices 50B, 50G, and 50R of each pixel.

In example embodiments, the organic photoelectric device 100 may include the first electrode 10, the active layer 30, and the second electrode 20, like the organic photoelectric device 100a described previously with reference to FIG. 1. However, example embodiments are not limited thereto and the organic photoelectric device 100 may be substituted with an organic photoelectric device that is the same as or similar to one of organic photoelectric devices 100b to 100d described in FIGS. 2 to 4. For example, as shown in FIG. 5B, an organic CMOS image sensor 200B according to example embodiments may include an organic photoelectric device 100' like the organic photoelectric device 100b described in FIG. 2, where the second electrode 20 may be the double-layered transmissive electrode having the light transmission auxiliary layer 20b on one side of the light transmission layer 20a.

Figure 5B:
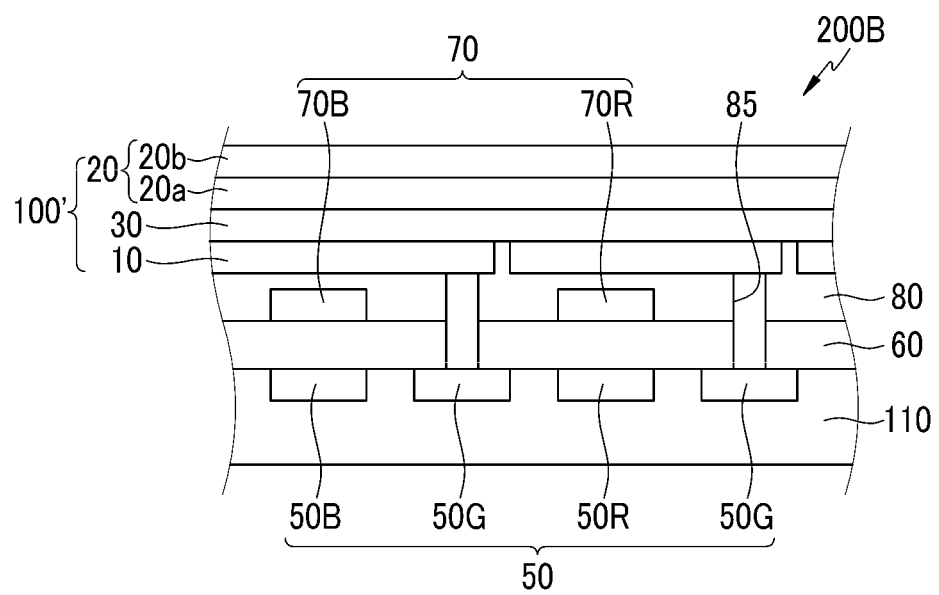

Referring to FIGS. 5A and 5B, the first and second electrodes 10 and 20 may be transmissive electrodes, and the active layer 30 may include an organic material mainly absorbing, for example, light in a green wavelength region. The active layer 30 may replace the color filter of a green pixel. The photo-sensing device 50 may include a photo-sensing device 50B of the blue pixel, a photo-sensing device 50G of the green pixel, and a photo-sensing device 50R of the red pixel.

When light enters through the second electrode 20, the light in a green wavelength region is mainly absorbed in the active layer 30 and photoelectrically converted, and the light in the rest of the wavelength region passes through the first electrode 10 and may be sensed by a photo-sensing device 50.

Accordingly, an organic CMOS image sensors 200A or 200B according to example embodiments includes the organic photoelectric device 100 or 100' including the transmissive electrode simultaneously satisfying light transmittance and electrical properties as aforementioned, and thus may increase the amount of light entering the active layer 30 and improve photoelectric conversion efficiency (EQE).

Although FIGS. 5A and 5B describe CMOS image sensors 200A and 200B according to example embodiments that are configured with blue B, green G, and red R pixels, example embodiments are not limited thereto. For example, as shown in FIG. 5C, a CMOS image sensor 200C according to example embodiments may be the same as the CMOS image sensor 200A in FIG. 5A, except for the color filter 70', active layer 30', and photo-sensing device 50'.

Figure 5C:
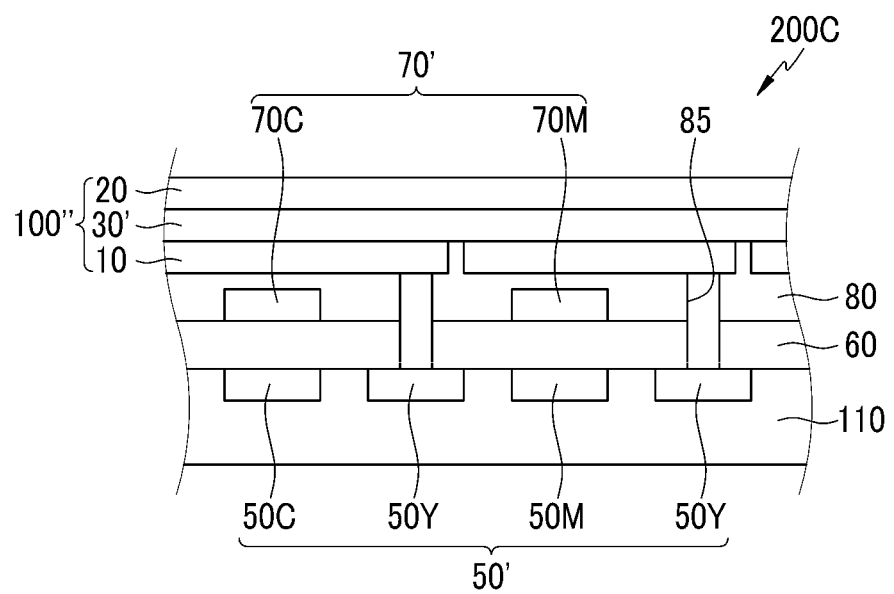

Referring to FIG. 5C, according to example embodiments, the CMOS image sensor 200C may have a color filter 70' and photo-sensing device 50' configured with a cyan C, yellow Y, and magenta M pixel arrangement. The color filter 70' may be formed on the upper insulation layer 80 and include a cyan filter 70B formed in a blue pixel and a red filter 70R formed in a red pixel. According to example embodiments, the color filter 70' does not include a magenta filter, but may include a magenta filter. The active layer 30' of the organic photoelectric device 100" may include an organic material mainly absorbing, for example, light in a magenta wavelength region. The active layer 30' may replace the color filter of a magenta pixel.

Although not shown in FIG. 5C, the organic photoelectric device 100" may further include charge auxiliary layers 15 and 25 between the first electrode 10 and the active layer 30' and between the second electrode 20 and the active layer 30', respectively, similar to the organic photoelectric device 100b described previously in FIG. 2. Additionally, the second electrode 20 of the CMOS image sensor 200C may be the double-layered transmissive electrode having the light transmission auxiliary layer 20b on one side of the light transmission layer 20a.

Figure 5D:
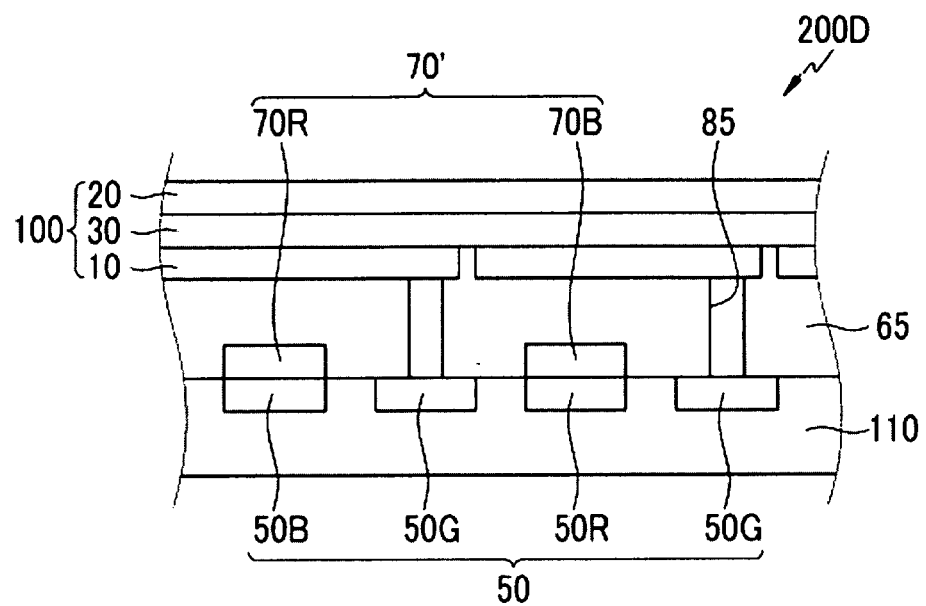
Figure 5E:
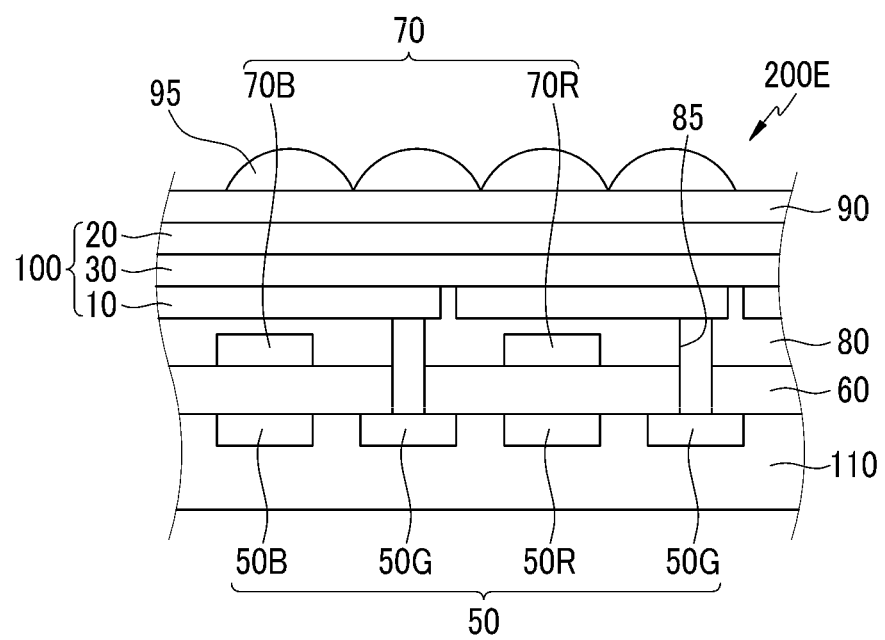

Referring to FIG. 5D, a CMOS image sensor 200D according to example embodiments may be the same as the CMOS image sensor 200A described previously in FIG. 5A, except for the insulation layers and position of the color filters.

As shown in FIG. 5D, the blue filter 70B and red filter 70R of the color filter 70 may be formed directly on the photo-sensing device 50B and photo-sensing device 50R. Instead of having the lower insulation layer 60 and upper insulation layer 80 descried in FIG. 5A, the CMOS image sensor 200D in FIG. 5D may include an insulation layer 65 formed as a single layer on the metal wire and the pad (not shown), and the color filter 70. The insulation layer 65 may have a contact hole (not shown) exposing the pad and a penetration hole 85 exposing the photo-sensing device 50G of the green pixel.

The insulation layer 65 may be made of an inorganic insulating material such as silicon oxide and/or silicon nitride, or a low dielectric constant (low K) material such as SiC, SiCOH, SiCO, and SiOF.

Hereinafter, the present disclosure is illustrated in more detail with reference to examples. However, these examples are non-limiting examples and example embodiments are not limited to the following examples.

Preparation of Transmissive Electrode I

Example 1

Silver (Ag) and molybdenum oxide (MoOx, $0<x\leq3$) are thermally deposited in a weight ratio of 99:1 (w/w) to form a 15 nm-thick transmissive electrode.

Example 2

Silver (Ag) and molybdenum oxide (MoOx, $0<x\leq3$) are thermally deposited in a weight ratio of 95:5 (w/w) to form a 15 nm-thick transmissive electrode.

Example 3

Silver (Ag) and molybdenum oxide (MoOx, $0<x\leq3$) are thermally deposited in a weight ratio of 90:10 (w/w) to form a 15 nm-thick transmissive electrode.

Example 4

Silver (Ag) and molybdenum oxide (MoOx, $0<x\leq3$) are thermally deposited in a weight ratio of 80:20 (w/w) to form a 15 nm-thick transmissive electrode.

Example 5

Silver (Ag) and molybdenum oxide (MoOx, 0<x≤3) are thermally deposited in a weight ratio of 60:40 (w/w) to form a 15 nm-thick transmissive electrode.

Comparative Example 1

Silver (Ag) and molybdenum oxide (MoOx, 0<x≤3) are thermally deposited in a weight ratio of 50:50 (w/w) to form a 15 nm-thick transmissive electrode.

Evaluation 1

The transmissive electrodes according to Examples 1 to 5 and Comparative Example 1 are evaluated regarding sheet resistance.

The sheet resistance is evaluated in a four point probe method.

The results are provided in Table 1.

TABLE 1

| | Sheet resistance (Ω/sq.) |
|---|---|
| Example 1 | 20 |
| Example 2 | 80-120 |
| Example 3 | 150-250 |
| Example 4 | 280-400 |
| Example 5 | 550-800 |
| Comparative Example 1 | >2000 |

Referring to Table 1, the transmissive electrodes according to Examples 1 to 5 have a sheet resistance of less than or equal to about 1 kΩ/sq., while the transmissive electrode according to Comparative Example 1 has a high sheet resistance of about 2 kΩ/sq.

Preparation of Transmissive Electrode II

Example 6

Silver (Ag) and molybdenum oxide (MoOx, 0<x≤3) are thermally deposited in a weight ratio of 90:10 (w/w) to form a 15 nm-thick transmissive electrode.

Example 7

A transmissive electrode is fabricated by thermally depositing silver (Ag) and molybdenum oxide (MoOx, 0<x≤3) in a ratio of 90:10 (w/w) to form a 15 nm-thick light transmission layer, and thermally depositing molybdenum oxide (MoOx, 0<x≤3, refractive index=1.8) to form a 30 nm-thick light transmission auxiliary layer.

Example 8

A transmissive electrode is fabricated by thermally depositing silver (Ag) and molybdenum oxide (MoOx, 0<x≤3) in a ratio of 90:10 (w/w) to form a 15 nm-thick light transmission layer, and thermally depositing a triphenyl amine derivative (refractive index=1.9) represented by the following formula A to form a 30 nm-thick light transmission auxiliary layer.

[Chemical Formula A]

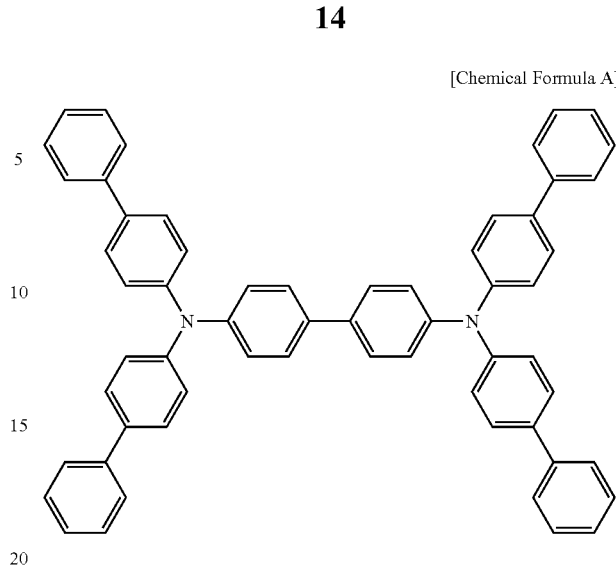

Comparative Example 2

Only silver (Ag) is thermally deposited to form a 15 nm-thick transmissive electrode.

Comparative Example 3

A transmissive electrode is fabricated by thermally depositing only silver (Ag) to form a 15 nm-thick light transmission layer, and further thermally depositing molybdenum oxide (MoOx, 0<x≤3) to form a 30 nm-thick light transmission auxiliary layer.

Evaluation 2

The transmissive electrodes according to Examples 6 to 8 and Comparative Examples 2 and 3 are evaluated regarding light transmittance.

The light transmittance is measured in a UV-visible spectrophotometry method.

Figure 6:
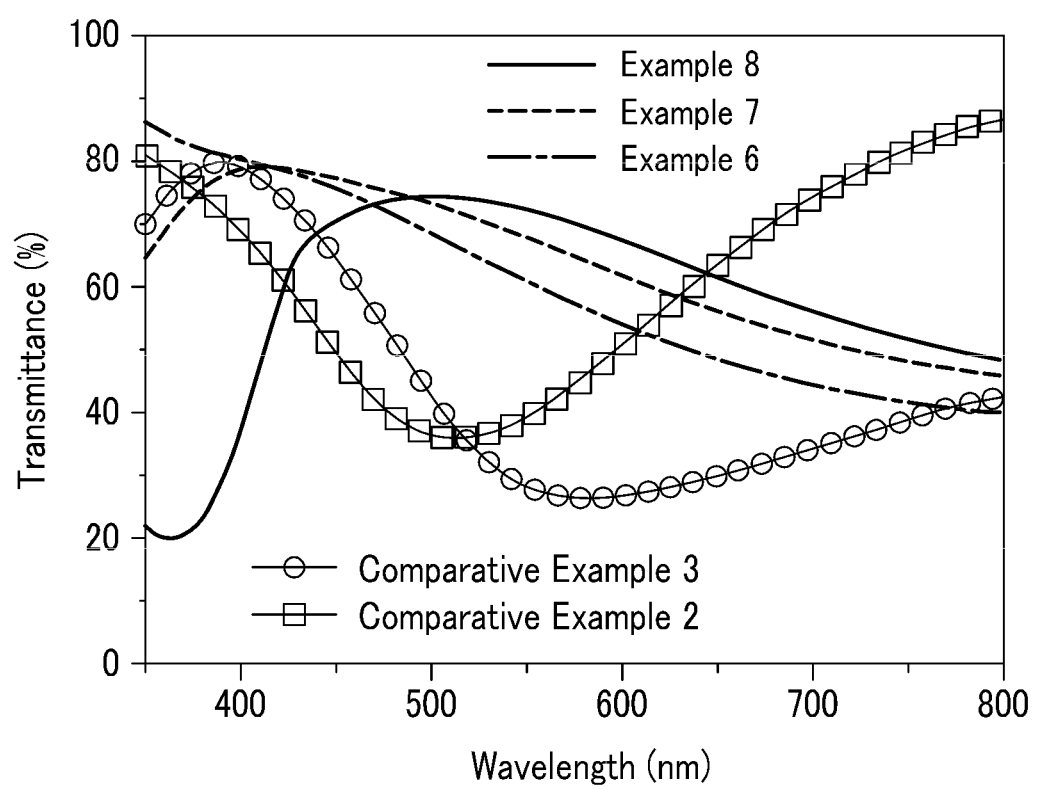
FIG. 6 is a graph showing light transmittance depending on wavelength of transmissive electrodes according to Examples 6 to 8 and Comparative Examples 2 and 3.

The results are explained referring to FIG. 6 and Table 2.

FIG. 6 is a graph showing light transmittance depending on a wavelength of transmissive electrodes according to Examples 6 to 8 and Comparative Examples 2 and 3.

TABLE 2

| | Light transmittance (@ 540 nm) % |
|---|---|
| Example 6 | 59 |
| Example 7 | 66 |
| Example 8 | 71 |
| Comparative Example 2 | 38 |
| Comparative Example 3 | 30 |

Referring to Table 2 and FIG. 6, the transmissive electrodes according to Examples 6 to 8 have 50% higher light transmittance at a wavelength of about 540 nm, while the transmissive electrodes according to Comparative Examples 2 and 3 have low light transmittance at a wavelength of about 540 nm. In addition, the transmissive electrodes according to Examples 6 to 8 have about 40% higher light transmittance over the entire visible ray region ranging from about 400 nm to 780 nm.

Manufacture of Organic Light Emitting Diode

Example 9

ITO is formed by sputtering to form about a 100 nm-thick electrode on a glass substrate. Next, DCV3T is deposited to form an electron transport layer (ETL) on the electrode, and N,N'-dimethyl-quinacridone (NNQA) as a p-type semiconductor material and dicyanovinyl-terthiophene (DCV3T) as an n-type semiconductor material in a ratio of 1:1 are codeposited to form a 70 nm-thick active layer on the electron transport layer (ETL). Then, molybdenum oxide is deposited to form a hole injection layer (HIL) on the active layer. On the hole injection layer (HIL), silver (Ag) and molybdenum oxide (MoOx, 0<x≤3) are thermally deposited in a ratio of 90:10 (w/w) to form a 15 nm-thick light transmission layer, fabricating an organic photoelectric device.

Example 10

An organic photoelectric device is fabricated according to the same method as Example 9, except for further forming a 30 nm-thick light transmission auxiliary layer by thermally depositing molybdenum oxide (MoOx, 0<x≤3) on the light transmission layer.

Example 11

An organic photoelectric device is fabricated according to the same method as Example 9, except for further forming a 30 nm-thick light transmission auxiliary layer by thermally depositing a triphenyl amine derivative represented by the above formula A on the light transmission layer.

Comparative Example 4

An organic photoelectric device is fabricated according to the same method as Example 9, except for forming a 15 nm-thick light transmission layer by thermally depositing only silver (Ag), instead of codepositing silver (Ag) and molybdenum oxide (MoOx, 0<x≤3) in a ratio of 90:10 (w/w).

Evaluation 3

The organic photoelectric devices according to Examples 9 to 11 and Comparative Example 4 are evaluated regarding External Quantum Efficiency (EQE) by applying various voltages thereto depending on a wavelength.

The results are explained referring to FIGS. 7 to 10.

Figure 7:
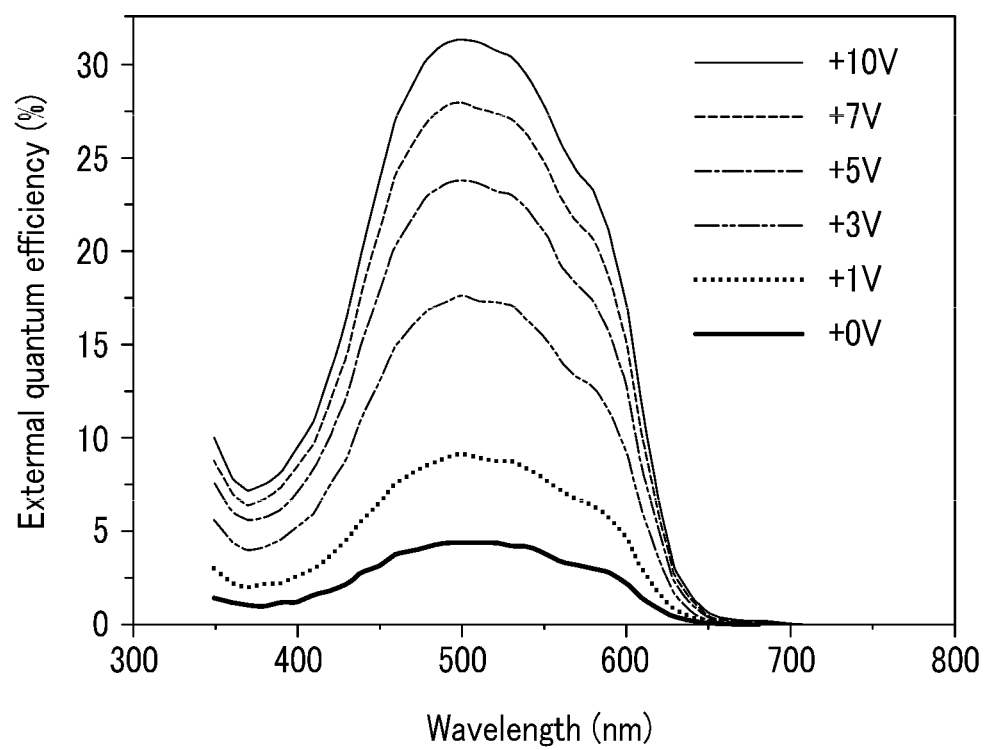
FIG. 7 is a graph showing external quantum efficiency (EQE) depending on wavelength of an organic photoelectric device according to Example 9.
Figure 8:
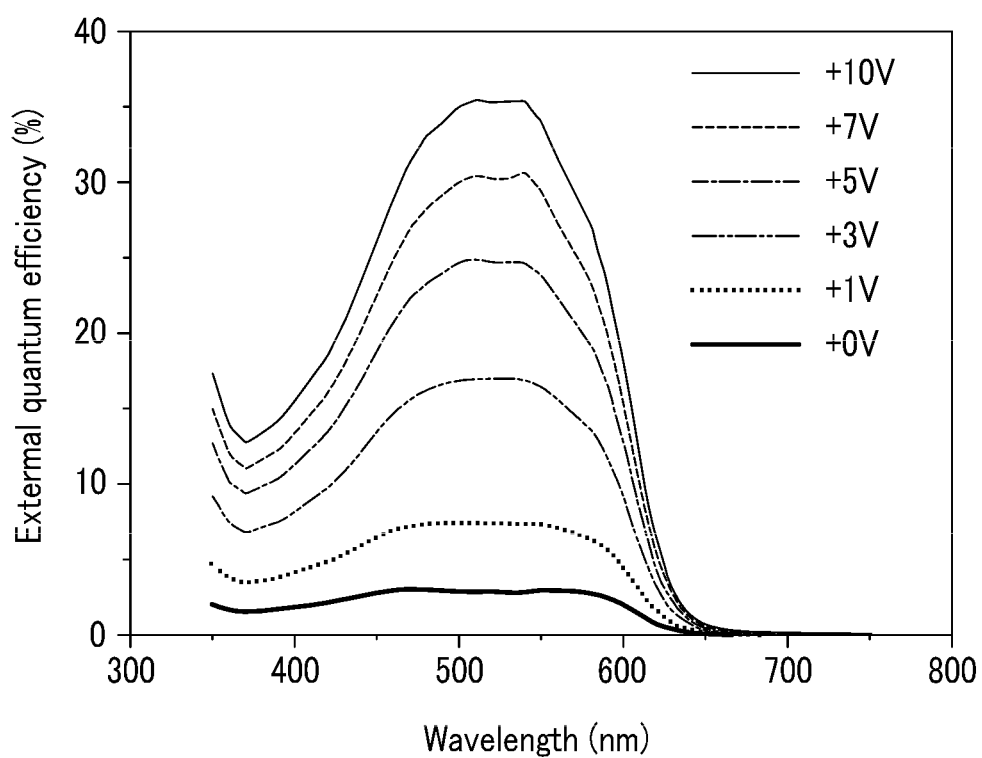
FIG. 8 is a graph showing external quantum efficiency (EQE) depending on wavelength of an organic photoelectric device according to Example 10.
Figure 9:
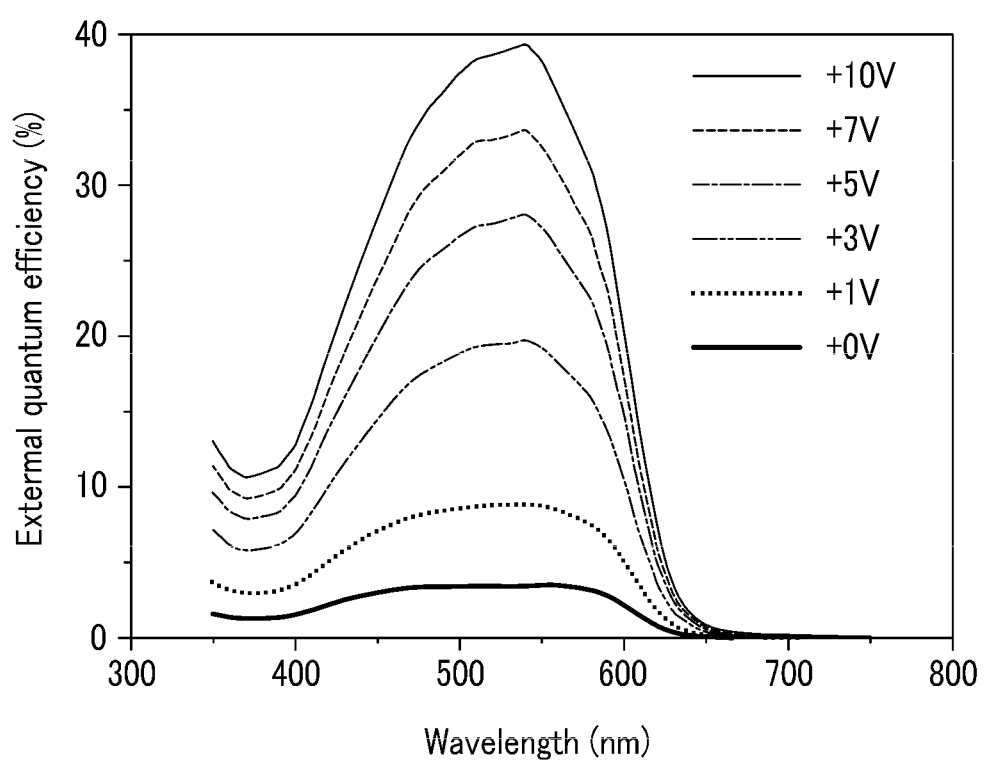
FIG. 9 is a graph showing external quantum efficiency (EQE) depending on wavelength of an organic photoelectric device according to Example 11.
Figure 10:
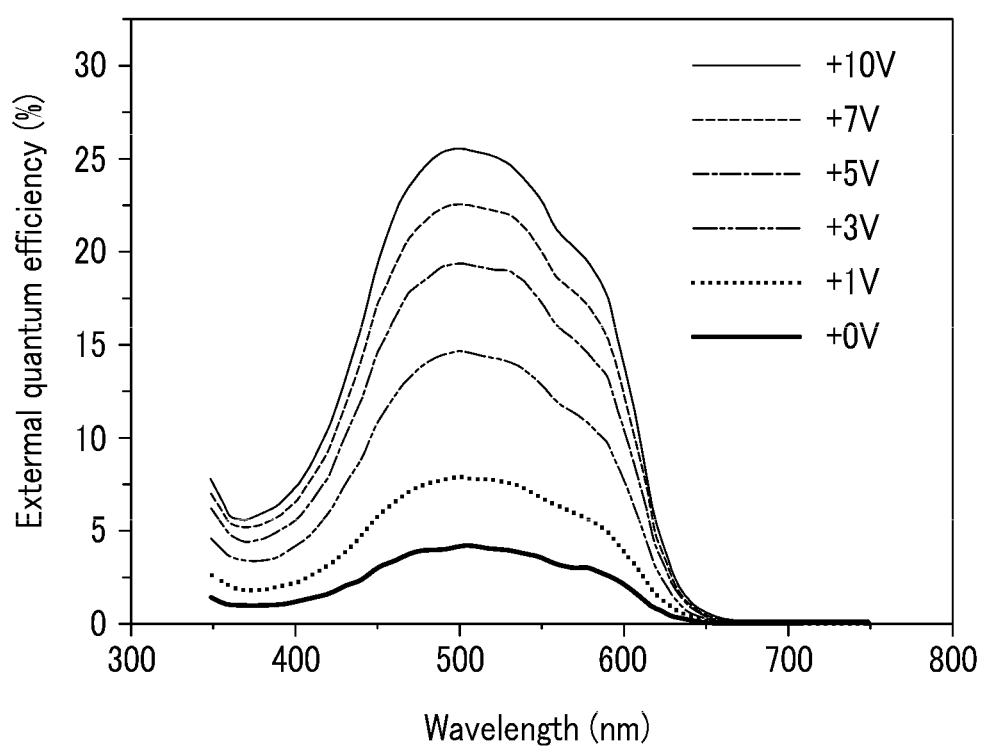
FIG. 10 is a graph showing external quantum efficiency (EQE) depending on wavelength of an organic photoelectric device according to Comparative Example 4.

FIG. 7 is a graph showing external quantum efficiency (EQE) depending on wavelength of an organic photoelectric device according to Example 9, FIG. 8 is a graph showing external quantum efficiency (EQE) depending on wavelength of an organic photoelectric device according to Example 10, FIG. 9 is a graph showing external quantum efficiency (EQE) depending on wavelength of an organic photoelectric device according to Example 11, and FIG. 10 is a graph showing external quantum efficiency (EQE) depending on wavelength of an organic photoelectric device according to Comparative Example 4.

Referring to FIGS. 7 to 10, the organic photoelectric devices according to Examples 9 to 11 have improved external quantum efficiency (EQE) compared with the one according to Comparative Example 4 based on the same voltage.

Evaluation 4

The organic photoelectric devices according to Example 9 and Comparative Example 4 are evaluated regarding dark current density by applying various biases.

Figure 11:
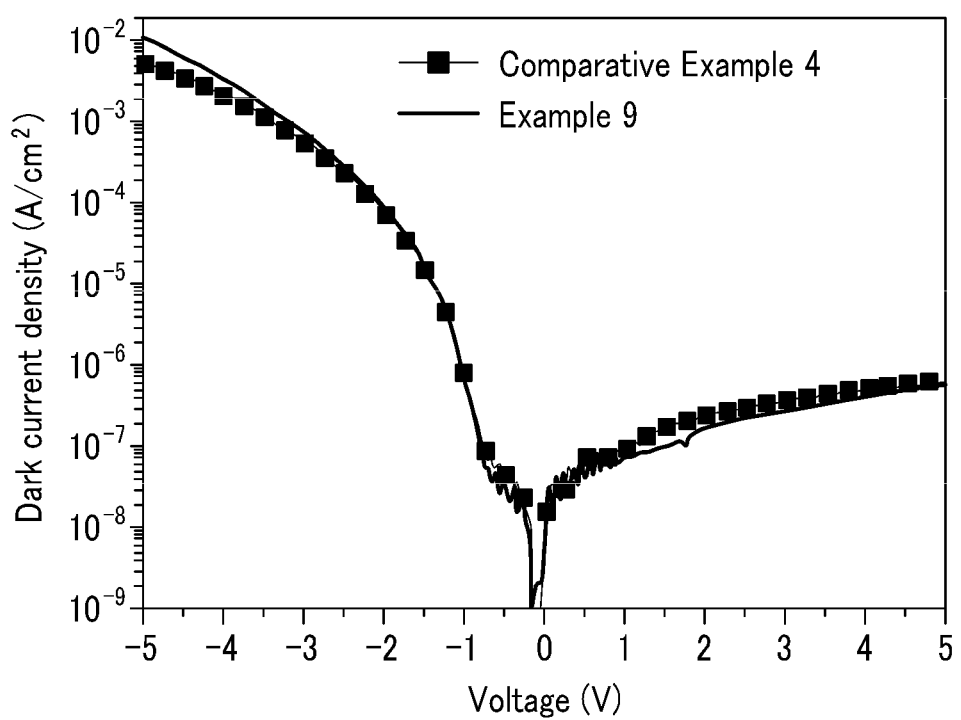
FIG. 11 is a graph showing dark current density depending on a voltage of organic photoelectric devices according to Example 9 and Comparative Example 4.

FIG. 11 is a graph showing dark current density depending on a voltage of organic photoelectric devices according to Example 9 and Comparative Example 4.

Referring to FIG. 11, the organic photoelectric device according to Example 9 has a similar dark current density in both constant and reverse voltage directions to the one according to Comparative Example 4. Accordingly, the organic photoelectric device according to Example 9 does not have a bigger leakage current, compared with the organic photoelectric device according to Comparative Example 4.

Figure 12A:
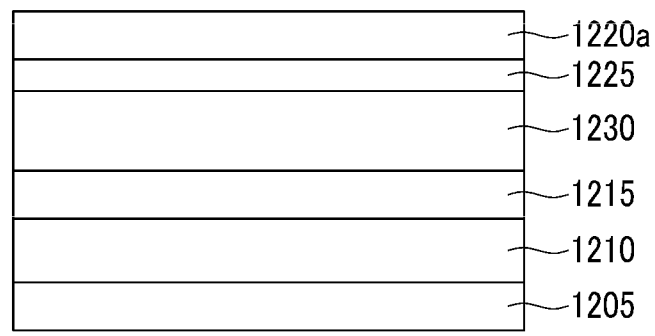
FIGS. 12A and 12B are cross-sectional views of organic light emitting diodes according to example embodiments.
Figure 12B:

FIGS. 12A and 12B are cross-sectional views of organic light emitting diodes according to example embodiments.

Referring to FIG. 12A, according to example embodiments, an organic light emitting diode 300A may include a substrate 1205, a lower electrode 1210, an electron transport layer 1215, an active layer 1230, a hole injection layer (HIL) 1225, and a light transmission layer 1220a stacked on each other.

The organic light emitting diode 300A may include materials corresponding to Example 9 discussed above. In other words, the substrate 1205 may be glass, the lower electrode 1210 may be a transparent conductive oxide (e.g., ITO), the ETL 1215 may be dicyanovinyl-terthiophene (DCV3T), the active layer 1230 may include N,N'-dimethyl-quinacridone (NNQA) as a p-type semiconductor material and dicyanovinyl-terthiophene (DCV3T) as an n-type semiconductor, the HIL 1225 may be molybdenum oxide (MoOx, 0<x≤3), and the light transmission layer 1220a may include silver (Ag) and molybdenum oxide.

However, example embodiments are not limited thereto and materials for the substrate 1205, lower electrode 1210, ETL 1215, active layer 1230, and light transmission layer 1220a may vary.

For example, the substrate 1205 may alternatively be a semiconductor such as silicon, and the lower electrode 1210 may be metal such as aluminum, silver, copper, or gold. Instead of DCV3T of molybdenum oxide, the ETL 1215 and HIL 1225 respectively may include other ones of the materials described above for when the charge auxiliary layers 15 and 25 in FIG. 2 are an electron transport layer (ETL) and a hole injection layer (HIL). Similarly, the active layer 1230 may be substituted with other materials described above for the active layer 30, and the light transmission layer 1220a may include the same materials as the second electrode 20.

Referring to FIG. 12B, according to example embodiments, an organic light emitting diode 300B may be the same as the organic light emitting diode described previously, except the organic light emitting diode may further include a light transmission auxiliary layer 1220b on the light transmission layer 1220a, for example as described previously in examples 10 and 11.

The light transmission auxiliary layer 1220b may include molybdenum oxide (MoOx, 0<x≤3) or a tripheynyl amine derivative represented by the above formula A. However, example embodiments are not limited thereto and the light transmission auxiliary layer 1220b may alternatively include other materials among those listed above for the light transmission auxiliary layer 20b described above.

While some example embodiments have been particularly shown and described, it will be understood by one of ordinary skill in the art that variations in form and detail may be made therein without departing from the spirit and scope of the claims.

What is claimed is:

1. A transmissive electrode, comprising:
  a single light transmission layer including a metal and a
    metal oxide that is included in a smaller amount than the
    metal, wherein
  the metal oxide of the light transmission layer is a dopant in
    the metal of the light transmission layer,
  a sheet resistance of the light transmission layer is less than
    or equal to about 1 kΩ/sq, and
  a light transmittance of the light transmission layer is more
    than about 50% at a wavelength of about 540 nm.

2. The transmissive electrode of claim 1, wherein a weight ratio of the metal and the metal oxide in the light transmission layer is about 99.9:0.1 to about 60:40.

3. The transmissive electrode of claim 1, wherein
the metal includes at least one of silver (Ag), aluminum (Al), copper (Cu), gold (Au), and an alloy thereof, and
the metal oxide includes one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

4. The transmissive electrode of claim 1, wherein a thickness the light transmission layer is about 1 nm to about 50 nm.

5. The transmissive electrode of claim 1, further comprising:
a light transmission auxiliary layer on one side of the light transmission layer.

6. The transmissive electrode of claim 5, wherein a material of the light transmission auxiliary layer has a refractive index of about 1.6 to about 2.5.

7. The transmissive electrode of claim 5, wherein the light transmission auxiliary layer includes at least one of a metal oxide compound, a metal sulfide, and an organic material.

8. The transmissive electrode of claim 7, wherein
the metal oxide compound includes one of zinc oxide, indium oxide, tin oxide, indium tin oxide (ITO), indium zinc oxide (IZO), aluminum oxide, aluminum tin oxide (ATO), fluorine doped tin oxide (FTO), molybdenum oxide, tungsten oxide, vanadium oxide, rhenium oxide, niobium oxide, tantalum oxide, titanium oxide, nickel oxide, copper oxide, cobalt oxide, manganese oxide, chromium oxide, and a combination thereof,
the metal sulfide includes zinc sulfide (ZnS), and
the organic material is an amine derivative.

9. An organic photoelectric device, comprising:
a first electrode;
a second electrode on the first electrode,
at least one of the first electrode and the second electrode including the transmissive electrode of claim 1; and
an active layer between the first electrode and second electrode.

10. The organic photoelectric device of claim 9, wherein a weight ratio of the metal and the metal oxide in the transmissive electrode is about 99.9:0.1 to about 60:40.

11. The organic photoelectric device of claim 9, wherein the metal in the transmissive electrode includes at least one of silver (Ag), aluminum (Al), copper (Cu), gold (Au), and an alloy thereof.

12. The organic photoelectric device of claim 9, wherein the metal oxide in the transmissive electrode comprises one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

13. The organic photoelectric device of claim 9, wherein a thickness of the light transmission layer in the transmissive electrode is about 1 nm to about 50 nm.

14. The organic photoelectric device of claim 9, wherein the transmissive electrode further includes a light transmission auxiliary layer on one side of the light transmission layer.

15. The organic photoelectric device of claim 14, wherein a material of the light transmission auxiliary layer has a refractive index of about 1.6 to about 2.5.

16. The organic photoelectric device of claim 15, wherein the light transmission auxiliary layer comprises at least one of a metal oxide compound, a metal sulfide, and an organic material.

17. The organic photoelectric device of claim 16, wherein
the metal oxide compound includes one of zinc oxide, indium oxide, tin oxide, indium tin oxide (ITO), indium zinc oxide (IZO), aluminum oxide, aluminum tin oxide (ATO), fluorine doped tin oxide (FTO), molybdenum oxide, tungsten oxide, vanadium oxide, rhenium oxide, niobium oxide, tantalum oxide, titanium oxide, nickel oxide, copper oxide, cobalt oxide, manganese oxide, chromium oxide, and a combination thereof,
the metal sulfide comprises zinc sulfide (ZnS), and
the organic material comprises an amine derivative.

18. The organic photoelectric device of claim 9, further comprising:
a charge auxiliary layer between at least one of the first electrode and the active layer and the second electrode and the active layer.

19. An image sensor comprising:
the organic photoelectric device according to claim 9.

20. An organic light emitting diode (OLED) comprising the transmissive electrode according to claim 1.

* * * * *